(12) United States Patent
Kawano

(10) Patent No.: US 9,106,299 B2
(45) Date of Patent: Aug. 11, 2015

(54) AUDIO SIGNAL PROCESSING CIRCUIT

(75) Inventor: Seiji Kawano, Saitama-Ken (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 241 days.

(21) Appl. No.: 13/572,171

(22) Filed: Aug. 10, 2012

(65) Prior Publication Data

US 2013/0039505 A1 Feb. 14, 2013

(30) Foreign Application Priority Data

Aug. 10, 2011 (JP) ................... 2011-175207

(51) Int. Cl.
| | | |
|---|---|---|
| H04H 40/72 | (2008.01) | |
| H04B 15/00 | (2006.01) | |
| H04B 1/10 | (2006.01) | |
| H03G 5/00 | (2006.01) | |
| H03G 5/16 | (2006.01) | |
| H04B 1/00 | (2006.01) | |

(52) U.S. Cl.
CPC ............. *H04B 1/1036* (2013.01); *H03G 5/005* (2013.01); *H03G 5/165* (2013.01); *H04B 1/0007* (2013.01)

(58) Field of Classification Search
CPC ....... H04B 1/1036; H03G 5/005; H03G 5/165
USPC .......... 381/106, 98, 317, 13, 71.1, 73.1, 94.1, 381/2, 14, 16, 57, 94.3
See application file for complete search history.

(56) References Cited

U.S. PATENT DOCUMENTS

| | | |
|---|---|---|
| 3,794,936 A | 2/1974 | Poschenrieder et al. |
| 4,130,726 A | 12/1978 | Kates et al. |
| 4,198,543 A | 4/1980 | Schertz et al. |

(Continued)

FOREIGN PATENT DOCUMENTS

| | | |
|---|---|---|
| CN | 1726650 A | 1/2006 |
| CN | 101170302 A | 4/2008 |

(Continued)

OTHER PUBLICATIONS

Patent Abstracts of Japan, Publication No. 2007-184990, Published on Jul. 19, 2007, 1 page.
Actions on the Merits for Copending U.S. Appl. No. 13/593,723, filed Aug. 24, 2012.
EPO English translation of CN1726650A.
Action on the Merits for Copending U.S. Appl. No. 13/593,723, filed Aug. 24, 2012.

*Primary Examiner* — Paul S Kim
*Assistant Examiner* — Katherine Faley

(57) ABSTRACT

An audio-signal-processing circuit includes: a noise-detecting unit to detect presence or absence of noise in an audio signal generated based on an output from a tuner configured to receive a broadcast signal; a low-pass filter, having predetermined phase characteristics, to pass the audio signal having a band of frequencies lower than a predetermined frequency; a high-pass filter, having the predetermined phase characteristics, to pass the audio signal having a band of frequencies higher than the predetermined frequency; first- and second-output units to multiply the signals outputted from the low-pass and high-pass filters by first and second coefficients and output the multiplied signals, respectively; an adding unit to add the signals respectively outputted from the first and the second output units; and a coefficient control unit to, when the noise-detecting unit has detected the presence of noise, decrease the second coefficient below the first coefficient.

20 Claims, 7 Drawing Sheets

(56) References Cited

U.S. PATENT DOCUMENTS

| | | |
|---|---|---|
| 4,569,076 A | 2/1986 | Holman |
| 8,150,066 B2 | 4/2012 | Kubo |
| 8,369,538 B2 | 2/2013 | Akiyama et al. |
| 8,582,784 B2 | 11/2013 | Minnaar |
| 8,615,093 B2 | 12/2013 | Hung et al. |
| 2006/0274903 A1* | 12/2006 | Aoki et al. ............... 381/56 |
| 2011/0142258 A1 | 6/2011 | Beer |

FOREIGN PATENT DOCUMENTS

| | | |
|---|---|---|
| CN | 101459865 A | 6/2009 |
| JP | 2005-278158 A | 10/2005 |
| JP | 2007-184990 A | 7/2007 |

* cited by examiner

AUDIO SIGNAL PROCESSING CIRCUIT

This application claims the benefit of priority to Japanese Patent Application No. 2011-175207, filed Aug. 10, 2011, of which full contents are incorporated herein by reference.

CROSS REFERENCE TO RELATED APPLICATION

Related subject matter is contained in a copending patent application No. 13/593,723, filed Aug. 24, 2012, entitled "Audio Signal Processing Circuit," invented by the inventor hereof and assigned to the assignee hereof.

BACKGROUND OF THE INVENTION

1. Field of the Invention

The present invention relates to an audio signal processing circuit.

2. Description of the Related Art

A general radio receiver performs different processing for an audio signal depending on presence or absence of noise (e.g., multipath noise and noise caused by adjacent channel interference) in the audio signal (see, e.g., Japanese Laid-Open Patent Publication No. 2007-184990).

FIG. 10 is a diagram illustrating an embodiment of an FM radio receiver 300. A broadcast signal received by an antenna 310 is converted by a tuner 320 into an intermediate frequency signal (IF signal). An IF processing unit 400 of a system LSI 330 performs demodulation processing for the IF signal, to generate an audio signal. A low-pass filter (LPF) 410 passes a low frequency component of the audio signal so as to remove noise from the audio signal. A noise detecting unit 450, based on the IF signal, detects presence or absence of noise in the audio signal. A control unit 460 controls switching of a switch 420, based on a detection result of the noise detecting unit 450. Specifically, if the noise detecting unit 450 detects the absence of noise, then the control unit 460 controls the switch 420 so that the audio signal directly outputted from the IF processing unit 400 is reproduced by a speaker (not shown). Whereas, if the noise detecting unit 450 detects the presence of noise, then the control unit 460 controls the switch 420 so that the audio signal with noise suppressed is reproduced by the speaker. As a result, in the radio receiver 300 the effect of noise on the audio signal is suppressed.

In the LPF 410, the inputted audio signal is outputted with a delay of a time period corresponding to the frequency of the audio signal. Therefore, as illustrated in FIG. 11, for example, when noise is detected and the switch 420 is switched to the LPF 410, the audio signal outputted from the switch 420 may change in phase abruptly. As such, in the radio receiver 300, although the effect of the multipath noise, etc., is suppressed, the sound quality can possibly deteriorate when the switch 420 is switched.

SUMMARY OF THE INVENTION

An audio signal processing circuit according to an aspect of the present invention, includes: a noise detecting unit configured to detect presence or absence of noise in an audio signal generated based on an output from a tuner configured to receive a broadcast signal; a low-pass filter, having predetermined phase characteristics, configured to pass the audio signal having a band of frequencies lower than a predetermined frequency; a high-pass filter, having the predetermined phase characteristics, configured to pass the audio signal having a band of frequencies higher than the predetermined frequency; a first output unit configured to multiply the signal outputted from the low-pass filter by a first coefficient and output the multiplied signal; a second output unit configured to multiply the signal outputted from the high-pass filter by a second coefficient and output the multiplied signal; an adding unit configured to add the signals respectively outputted from the first and the second output units; and a coefficient control unit configured to, when the noise detecting unit has detected the presence of noise, decrease the second coefficient below the first coefficient.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

Figure 1:
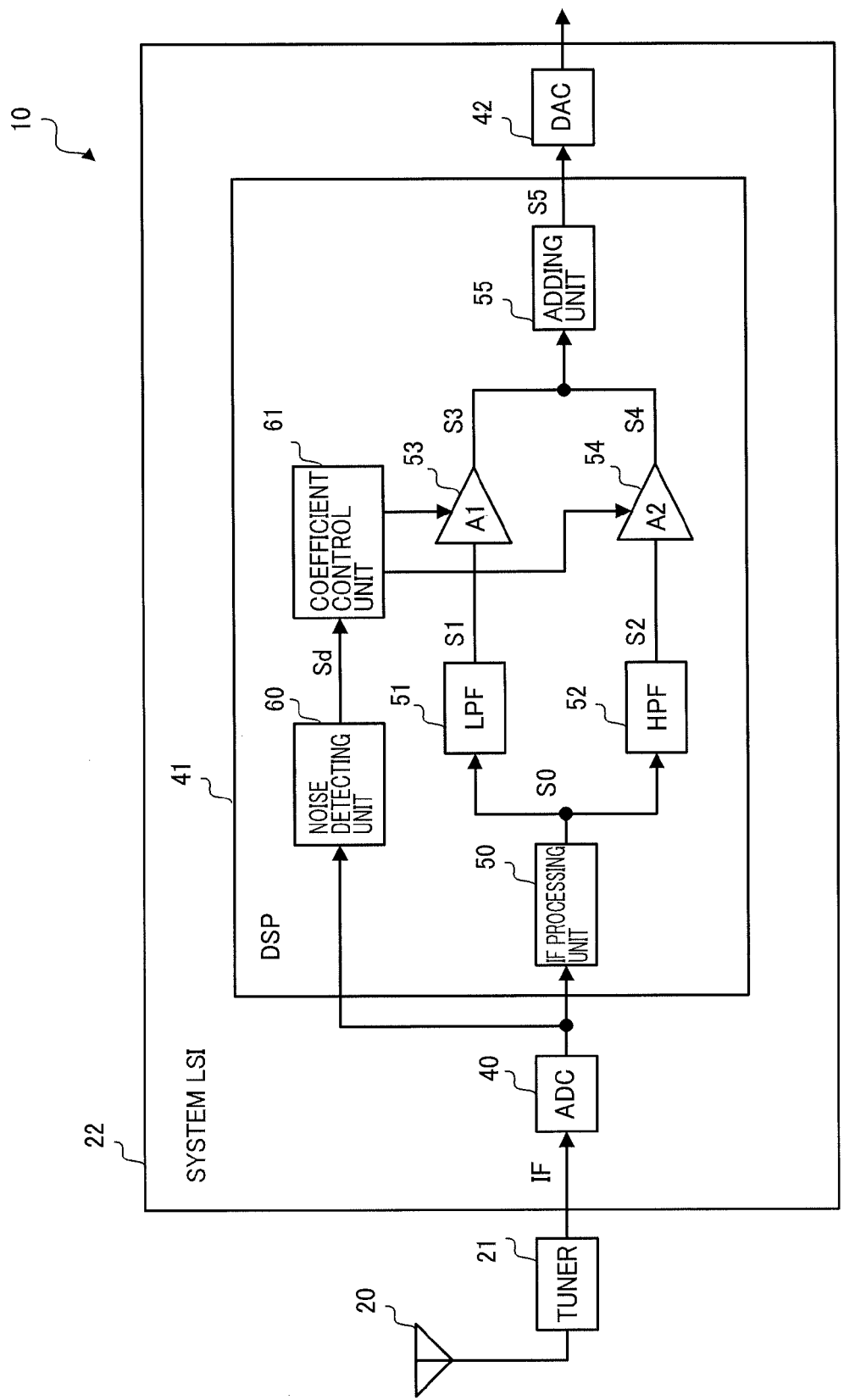
FIG. 1 is a diagram illustrating a configuration of a radio receiver 10 according to one embodiment of the present invention.

FIG. 1 is a diagram illustrating a configuration of a radio receiver 10 according to an embodiment of the present invention. The radio receiver 10 is provided in car stereo equipment (not shown), for example, and includes an antenna 20, a tuner 21, and a system LSI (Large Scale Integration) 22.

The tuner 21 is configured to extract a broadcast signal of a designated receiving station from an FM (Frequency Modulation) multiple broadcast signals received by way of the antenna 20, for example, convert the broadcast signal into an IF signal, and output the converted signal.

The system LSI 22 includes an AD converter (ADC) 40, a digital signal processing circuit (DSP) 41, and a DA converter (DAC) 42.

The ADC 40 is configured to convert the IF signal outputted from the tuner 21 to a digital signal, and output the converted signal to the DSP 41. In the DSP 41 (audio signal processing circuit), an audio signal is generated, while noise of the generated signal is suppressed. The DSP 41 includes an IF processing unit 50, a low-pass filter (LPF) 51, a high-pass filter (HPF) 52, amplifiers 53 and 54, an adding unit 55, a noise detecting unit 60, and a coefficient control unit 61, for example. The blocks included in the DSP 41 are functional blocks realized by a DSP 41 core (not shown) executing a program stored in a memory (not shown), for example.

The IF processing unit 50 is configured to perform demodulation processing for the IF signal, and generate an audio signal S0. The low-pass filter 51 is a filter configured to pass the audio signal S0 of the band lower than the predetermined frequency fc (e.g., 3 kHz), while the high-pass filter 52 is a filter configured to pass the audio signal S0 of the band higher than the predetermined frequency fc. In an embodiment of the present invention, the audio signal outputted from the low-pass filter 51 is given as an audio signal S1 and the audio signal outputted from the high-pass filter 52 is given as an audio signal S2.

Figure 2:
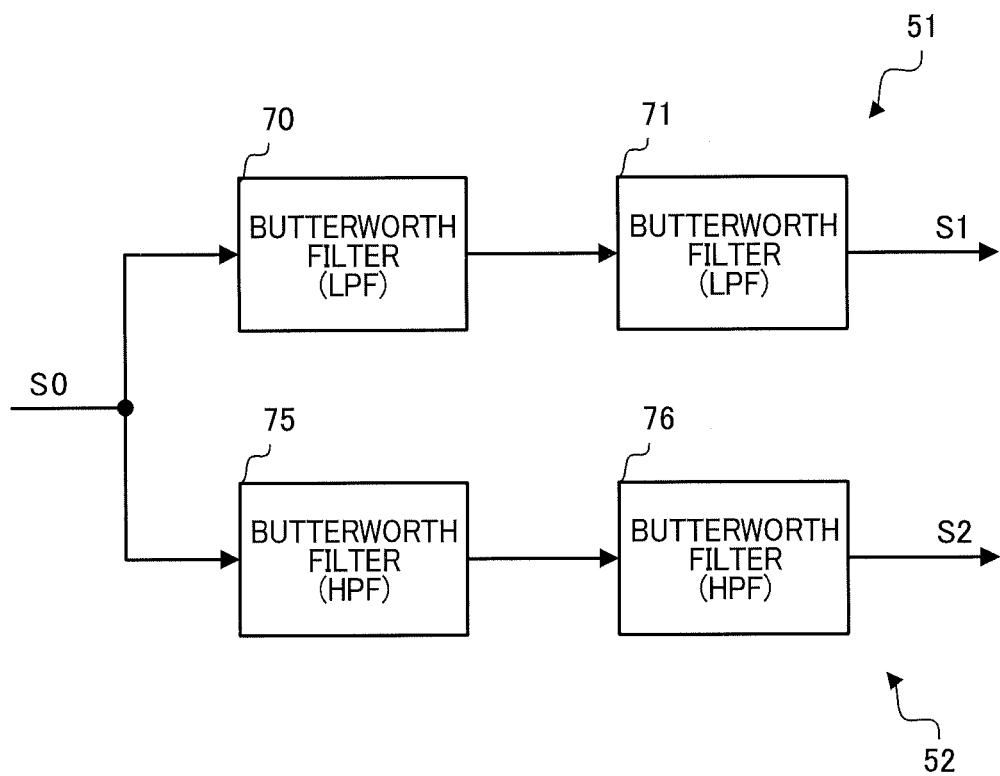
FIG. 2 is a diagram illustrating one example of a low-pass filter 51 and a high-pass filter 52.

As illustrated in FIG. 2, the low-pass filter 51 includes second-order Butterworth filters 70 and 71 configured to pass the audio signal S0 of the band lower than the predetermined frequency fc. Since the Butterworth filters 70 and 71 are connected in series, the Butterworth filters 70 and 71 constitute a so-called Linkwitz-Riley filter.

Figure 3:
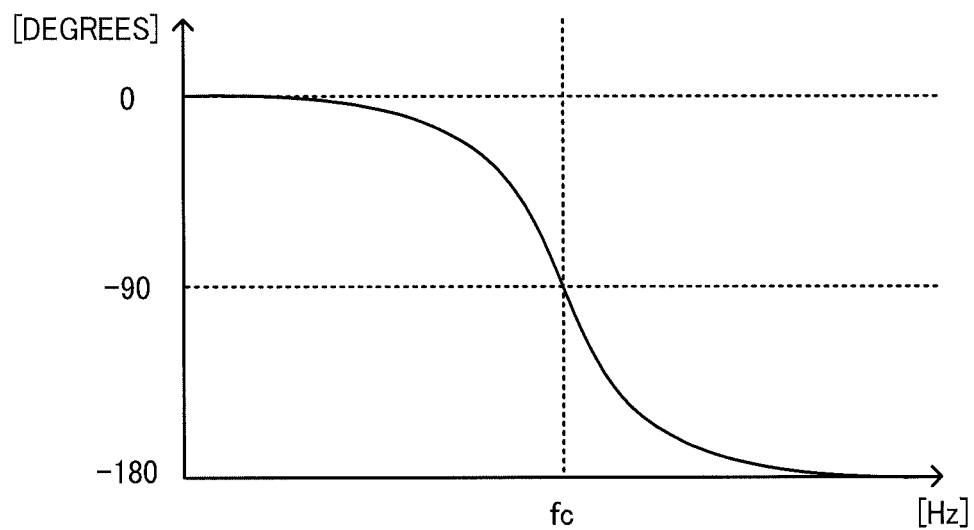
FIG. 3 is a diagram illustrating one example of phase characteristics of Butterworth filters 70 and 71.
Figure 4:
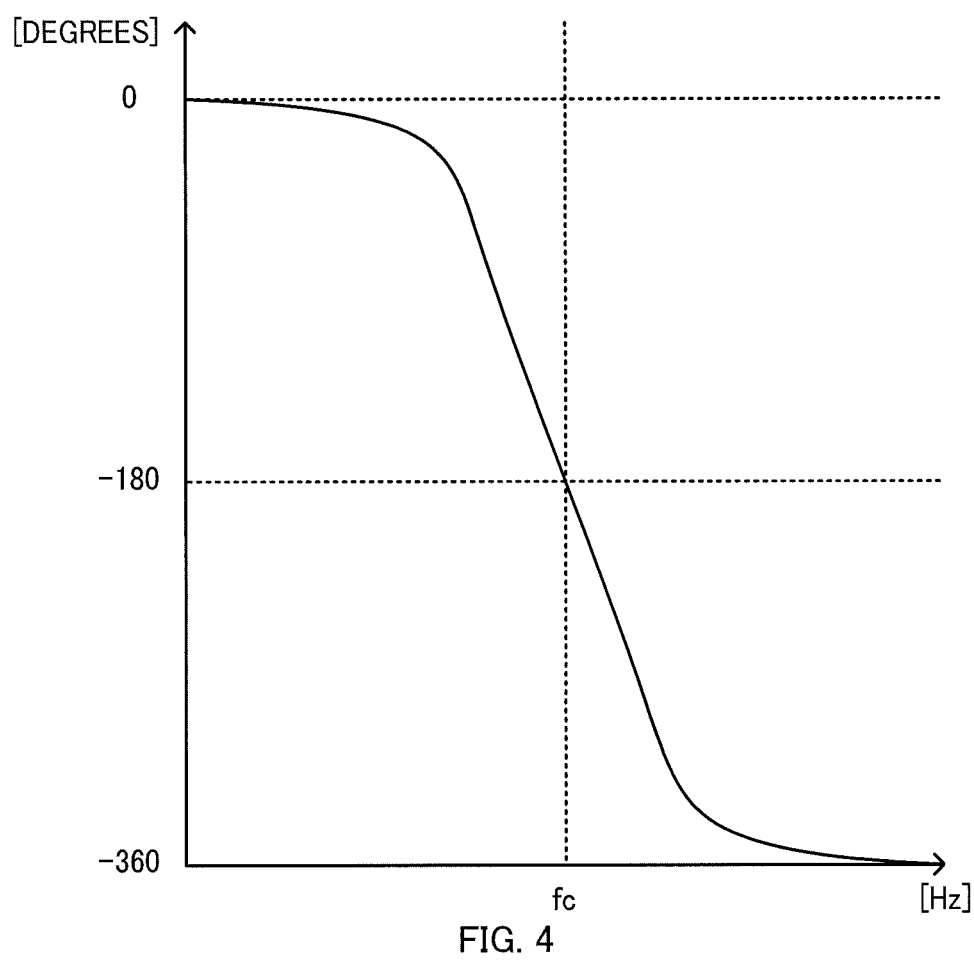
FIG. 4 is a diagram illustrating one example of phase characteristics of a low-pass filter 51.

FIG. 3 is a diagram illustrating phase characteristics (phase response) in each of the Butterworth filters 70 and 71. Since the Butterworth filters 70 and 71 each are a second-order low-pass filter, when the frequency of the signal inputted to the Butterworth filters 70 and 71 is sufficiently low, a phase delay of the output signal is of the order of 0 degrees. Whereas, when the frequency of the signal inputted to the Butterworth filters 70 and 71 is sufficiently high, the phase delay of the output signal is of the order of 180 degrees. When the frequency of the signal inputted to the Butterworth filters 70 and 71 is the predetermined frequency fc, the phase delay of the output signal is 90 degrees. Therefore, the low-pass filter 51 in which such Butterworth filters 70 and 71 are cascade-connected has the phase characteristics as illustrated in FIG. 4.

The high-pass filter 52, similarly to the low-pass filter 51, includes second-order Butterworth filters 75 and 76 configured to pass the audio signal S0 of the band higher than the predetermined frequency fc. Thus, the Butterworth filters 75 and 76 also constitute the Linkwitz-Riley filter. The filters are designed such that Q values of the Butterworth filters 70, 71, 75, and 76 become equal.

Figure 5:
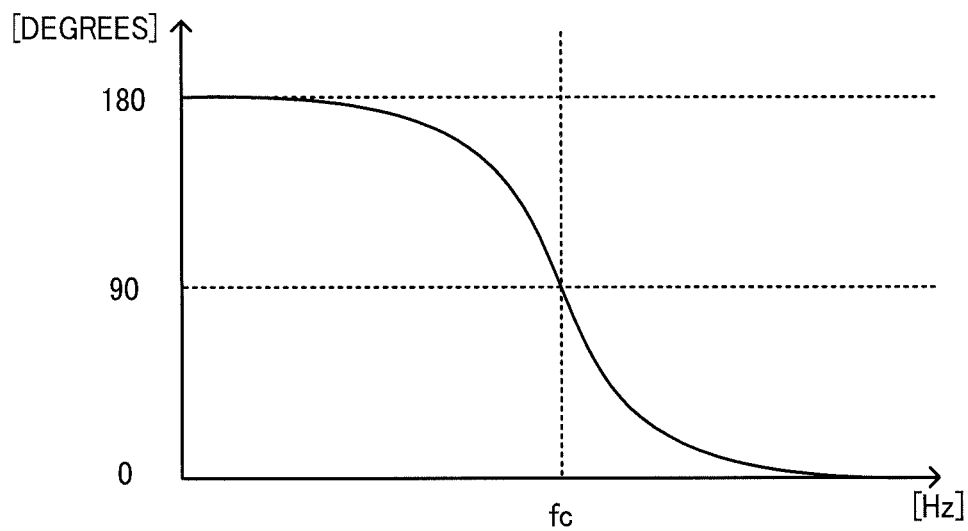
FIG. 5 is a diagram illustrating one example of phase characteristics of Butterworth filters 75 and 76.
Figure 6:
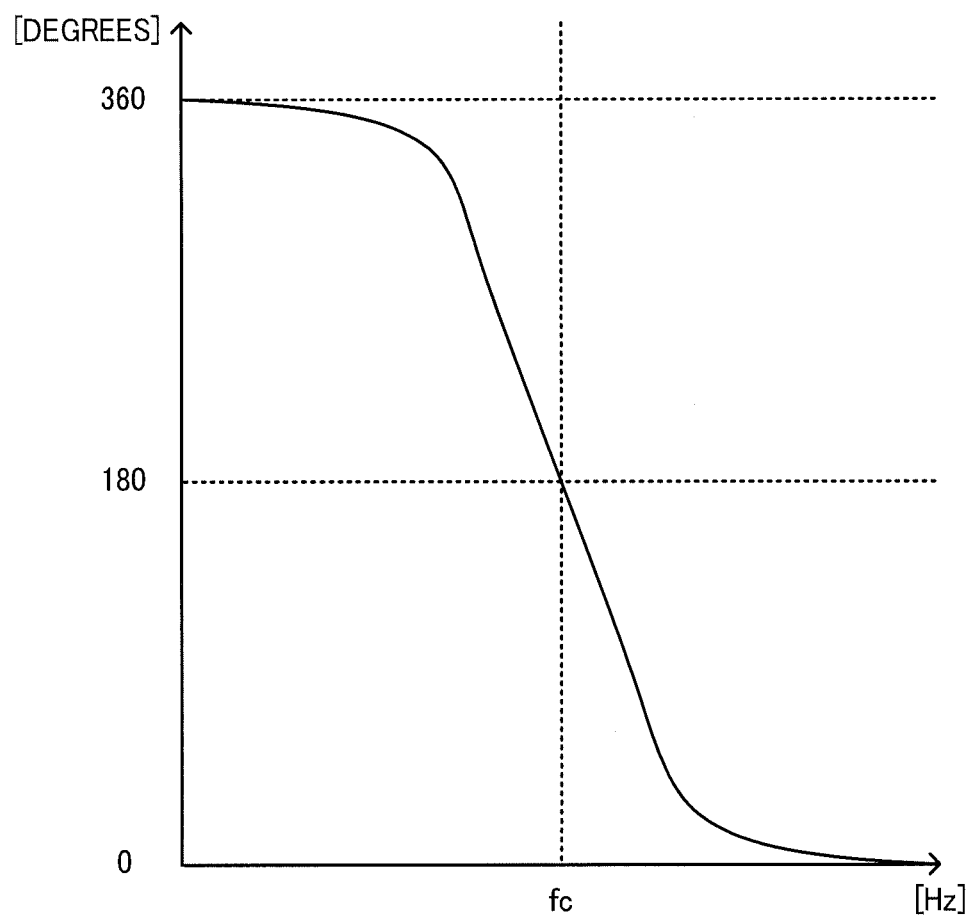
FIG. 6 is a diagram illustrating one example of phase characteristics of a high-pass filter 52.

FIG. 5 is a diagram illustrating the phase characteristics in each of the Butterworth filters 75 and 76. Since the Butterworth filters 75 and 76 each are a second-order high-pass filter, when the frequency of the signal inputted to the Butterworth filters 75 and 76 is sufficiently low, a phase advance of the output signal is of the order of 180 degrees. Whereas, when the frequency of the signal inputted to the Butterworth filters 75 and 76 is sufficiently high, the phase advance of the output signal is of the order of 0 degrees. When the frequency of the signal inputted to the Butterworth filters 75 and 76 is the predetermined frequency fc, the phase advance of the output signal is 90 degrees. Therefore, the high-pass filter 52 in which such Butterworth filters 75 and 76 are cascade-connected has the phase characteristics as illustrated in FIG. 6. Incidentally, there is a phase shift of 360 degrees between the phase characteristics illustrated in FIG. 6 and the phase characteristics shown in FIG. 4. Thus, irrespective of the frequency of the input audio signal S0, the audio signal S1 outputted from the low-pass filter 51 and the audio signal S2 outputted from the high-pass filter 52 are in phase.

Figure 7:
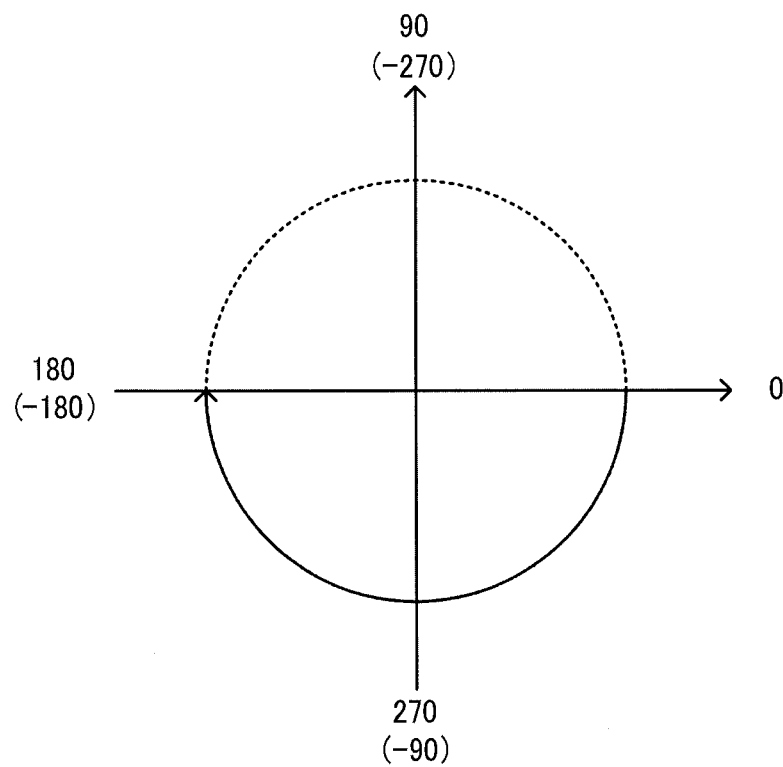
FIG. 7 is a diagram for description of a phase delay of an audio signal having a frequency fc to pass through a low-pass filter 51.
Figure 8:
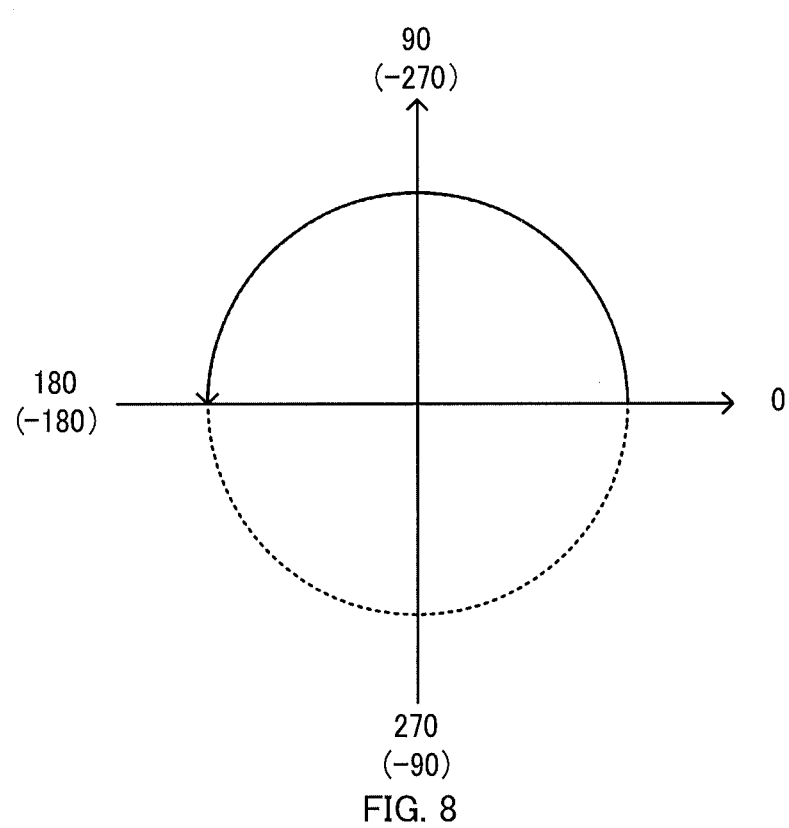
FIG. 8 is a diagram for description of a phase advance of an audio signal having a frequency fc to pass through a high-pass filter 52.

Specifically, as illustrated in FIG. 7, for example, if the audio signal S0 having the frequency fc is inputted to the low-pass filter 51, the audio signal S1 is delayed in phase by 180 degrees with respect to the audio signal S0. Whereas, as illustrated in FIG. 8, if the audio signal S0 having the frequency fc is inputted to the high-pass filter 52, the audio signal S2 is advanced in phase by 180 degrees with respect to the audio signal S0. As such, the phase is delayed in the low-pass filter 51 and the phase is advanced in the high-pass filter 52, however, both of the phases of the audio signals S1 and S2 become 180 degrees and the signals S1 and S2 are in phase.

The amplifier 53 (first output unit) is configured to multiply the audio signal S1 outputted from the low-pass filter 51 by a coefficient A1 (first coefficient), and output the multiplied signal. Namely, the amplifier 53 multiplies the audio signal S1 by the coefficient A1, and outputs the multiplied signal as an audio signal S3.

The amplifier 54 (second output unit) is configured to, similarly to the amplifier 53, multiply the audio signal S2 outputted from the high-pass filter 52 by a coefficient A2 (second coefficient), and output the multiplied signal as an audio signal S4. It is assumed that the initial value is set at "1", for example, for each of the coefficients A1 and A2. Since the amplifiers 53 and 54 are designed such that the audio signals S1 and S2 are equal in phase delay at the amplifiers 53 and 54, the audio signals S3 and S4 are in phase with each other.

The adding unit 55 is configured to add the audio signals S3 and S4 and outputs the added signals to the DA converter 42. The DA converter 42 is configured to convert the signals, obtained by addition by the adding unit 55, into an analog signal, so as to reproduce the signals with a speaker (not shown).

The noise detecting unit 60 is configured to, based on the digitized IF signal, detect if there is any occurrence of noise that worsens the sound quality of the audio signal S0. Specifically, the noise detecting unit 60 detects presence or absence of noise such as the multipath noise and noise caused by adjacent channel interference, for example. The noise detecting unit 60 outputs a high level ("H" level) detection signal Sd when detecting the presence of noise, and outputs a low level ("L" level) detection signal Sd when detecting the absence of noise.

The coefficient control unit 61 is configured to, when the high level detection signal Sd is outputted thereto, increase the coefficient A1 from the initial value of "1" to "2", for example, and decrease the coefficient A2 from the initial value of "1" to "0", for example. Thus, after detection of noise, the amplitude of the audio signal S3 is doubled and the amplitude of the audio signal S4 is reduced to zero. Also, the coefficient control unit 61 is configured to, when the low level detection signal Sd is outputted thereto, decrease the coefficient A1 from "2" to the initial value of "1", and increase the coefficient A2 from "0" to the initial value of "1".

==Example of Operation of Radio Receiver 10 when Noise is Generated==

Figure 9:
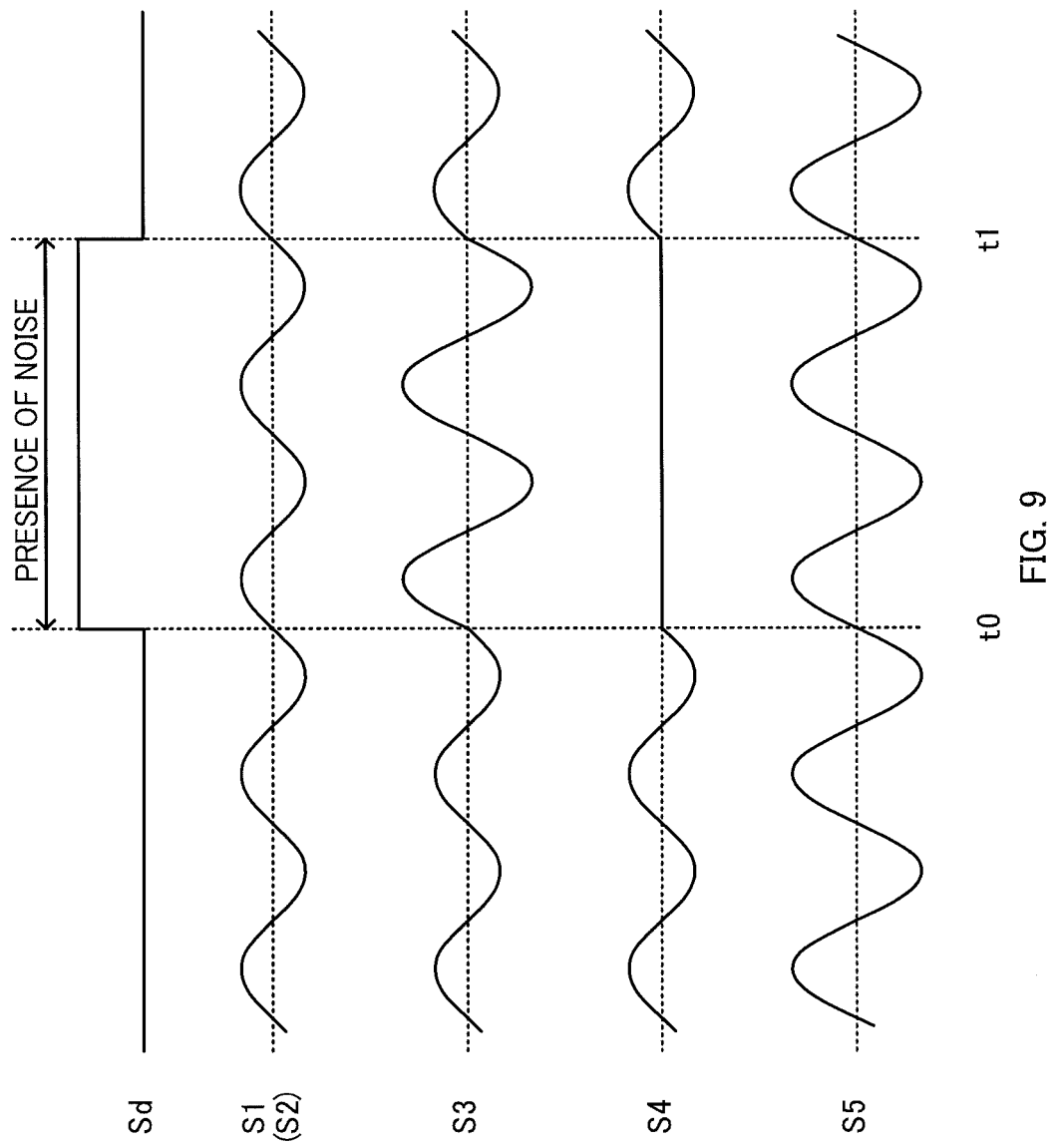
FIG. 9 is a diagram for description of an operation of a radio receiver 10.
Figure 10:
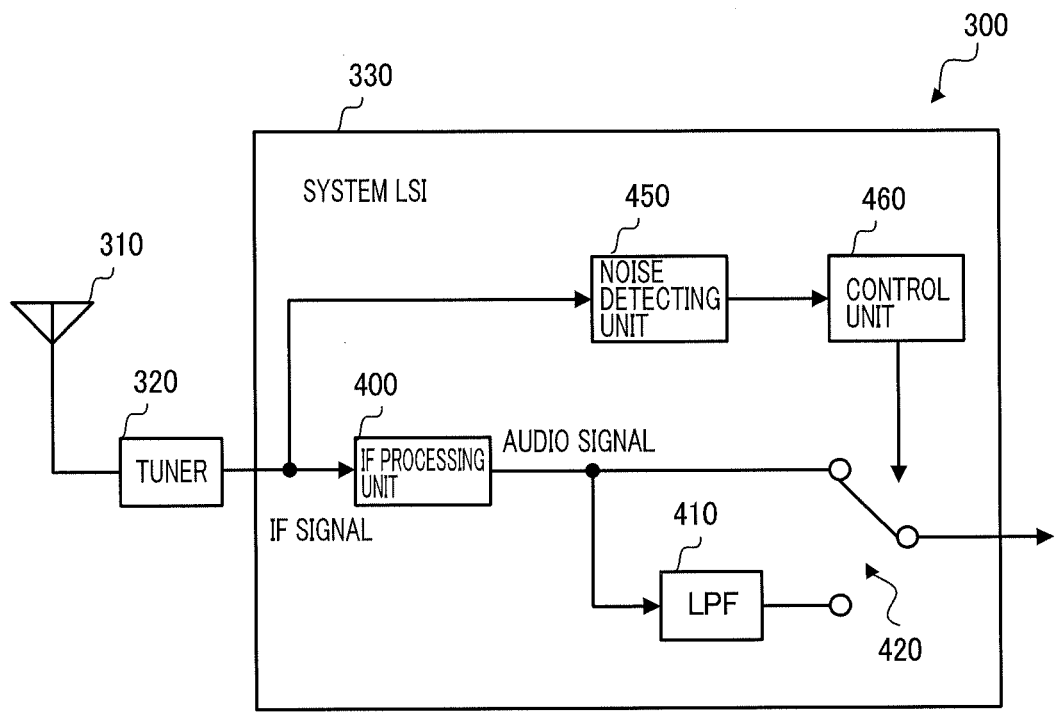
FIG. 10 is a diagram of a configuration of a general radio receiver 300.
Figure 11:
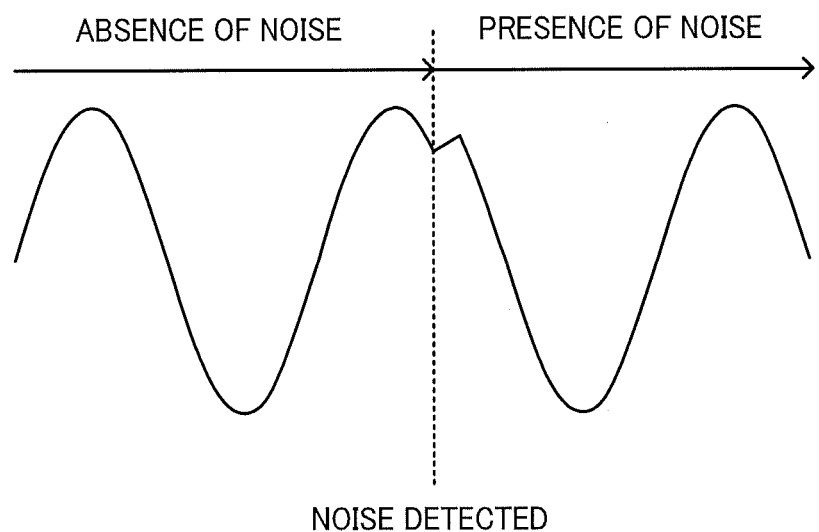
FIG. 11 is a diagram illustrating one example of a waveform of an audio signal to be outputted from a radio receiver 300.

FIG. 9 is a diagram illustrating an operation of the radio receiver 10 when noise is generated. For the sake of convenience, FIG. 9 illustrates only the signal having the predetermined frequency fc out of the signals within the audible frequency range. Since the cutoff frequency is the frequency fc and the phase characteristics are the same in the low-pass filter 51 and the high-pass filter 52, the audio signals S1 and S2 have amplitudes and phases equal to each other.

In the time period before time t0 at which the multipath noise is generated, for example, since the detection signal Sd is low ("L" level), both of the coefficients A1 and A2 are "1". Therefore, the audio signals S3 and S4, equal to the audio signals S1 and S2, are outputted. Since the audio signals S3 and S4 are added, an audio signal S5, having an amplitude twice as large as that of the audio signals S3 and S4, is outputted.

When the multipath noise is generated at time t0, the detection signal Sd goes high. Thus, the coefficient A1 increases from "1" to "2" and the coefficient A2 decreases from "1" to "0". Therefore, the amplitude of the audio signal S3 becomes twice as large as that of the audio signal S1, and the amplitude of the audio signal S4 is reduced to zero. When the coefficient A2 becomes "0", the output from the high-pass filter 52, containing a large proportion of the signals more susceptible to the multipath noise, becomes zero. Therefore, in the audio signal S5, the effect of the multipath noise is suppressed. Since the audio signal S3 is outputted as the audio signal S5, the audio signal S5 does not change in amplitude even at time t0.

When the multipath noise disappears at time t1, the detection signal Sd goes low. Thus, the coefficient A1 decreases from "2" to "1" and the coefficient A2 increases from "0" to "1". Therefore, the audio signals S3 to S5 in the state at and before time t0 are outputted.

The radio receiver 10 according to an embodiment of the present invention has been described above. In DSP 41, upon detection of the presence of noise, the audio signal S2 in a high frequency range, susceptible to noise, is attenuated. Thus, the effect of noise can be suppressed in the audio signal S5 outputted from the DSP 41. Further, the low-pass filter 51 and the high-pass filter 52 have equal phase characteristics, and the audio signals S3 and S4 having no phase shift are added. Therefore, since there is no rapid change in the phase of the audio signal S5, the audio signal S5 with good sound quality is reproduced. Thus, the DSP 41 is capable of outputting the audio signal S5 with good sound quality while removing noise from the audio signal S0.

Upon detection of the absence of noise, the coefficient A2 increases up to the initial value of "1". Therefore, the audio signal S5 to be reproduced by the speaker again contains the audio signal S3 of the low frequency component and the audio signal S4 of the high frequency component, thereby reproducing sound with good sound quality.

When the presence of noise is detected, if only the coefficient A2, for example, is decreased without changing the coefficient A1, the effect of noise can be suppressed. In such a case, however, since the amplitude of the audio signal S5 decreases to be small, the volume of the sound to be reproduced by the speaker is lowered as well. In an embodiment of the present invention, the coefficient A1 increases upon detection of noise, thereby being able to prevent lowering of the volume of the sound to be reproduced by the speaker while suppressing the effect of noise.

Upon detection of the absence of noise, the coefficient A1 decreases down to the initial value of "1". Thus, the DSP 41 can accurately reproduce the audio signal S0 inputted thereto.

In order to generate the audio signals S3 and S4 having no phase shift, it is only necessary that the low-pass filter 51 and the high-pass filter 52 are the same in phase characteristics.

Therefore, for example, it may be so configured that a filter having four first-order low-pass filters (cutoff frequency fc) cascade-connected is used as the low-pass filter 51 and a filter having four first-order high-pass filters (cutoff frequency fc) cascade-connected is used as the high-pass filter 52. It may also be so configured that a filter having two second-order low-pass Chebyshev filters (cutoff frequency fc) cascade-connected is used as the low-pass filter 51 and a filter having two second-order high-pass Chebyshev filters (cutoff frequency fc) cascade-connected will is as the high-pass filter 52. While a description has been made herein of an embodiment in which there is a 360-degree shift between the phase characteristics of the low-pass filter 51 and the phase characteristics of the high-pass filter 52, the shift may be 720 degrees, for example. However, in the case of using the Chebyshev filter, for example, a ripple, etc., may possibly occur in the signal outputted from the Chebyshev filter. For this reason, as in an embodiment of the present invention, the use of the Linkwitz-Riley filter (low-pass filter 51) configured with the Butterworth filters 70 and 71, for example, can more effectively prevent the lowering of the sound quality.

While both of the coefficients A1 and A2 of the amplifiers 53 and 54 are "1" and the amplifiers 53 and 54 output the audio signals S1 and S2 without changing the amplitude thereof, it is not limited thereto. For example, the coefficients A1 and A2 of the amplifiers 53 and 54 may use a value (e.g., "2") greater than "1" to amplify the audio signals S1 and S2. Further, each of the blocks of the DSP 41 may be configured with hardware.

The above embodiments of the present invention are simply for facilitating the understanding of the present invention and are not in any way to be construed as limiting the present invention. The present invention may variously be changed or altered without departing from its spirit and encompass equivalents thereof.

What is claimed is:

1. An audio signal processing circuit comprising:
   a noise detecting unit configured to detect presence or absence of noise in an audio signal generated based on an output from a tuner configured to receive a broadcast signal;
   a low-pass filter, having predetermined phase characteristics, configured to pass the audio signal having a band of frequencies lower than a predetermined frequency;
   a high-pass filter, having the predetermined phase characteristics, configured to pass the audio signal having a band of frequencies higher than the predetermined frequency;
   a first output unit configured to multiply the signal outputted from the low-pass filter by a first coefficient and output the multiplied signal;
   a second output unit configured to multiply the signal outputted from the high-pass filter by a second coefficient and output the multiplied signal;
   an adding unit configured to add the signals respectively outputted from the first and the second output units; and
   a coefficient control unit configured to, when the noise detecting unit has detected the presence of noise, decrease the second coefficient below the first coefficient.

2. The audio signal processing circuit of claim 1, wherein the coefficient control unit is further configured to, when the noise detecting unit has detected the absence of noise after detecting the presence of noise, increase the second coefficient to a value before detection of the presence of noise.

3. The audio signal processing circuit of claim 2, wherein the coefficient control unit is further configured to, when the noise detecting unit has detected the presence of noise, decrease the second coefficient as well as increase the first coefficient so that the second coefficient becomes smaller than the first coefficient.

4. The audio signal processing circuit of claim 3, wherein the coefficient control unit is further configured to, when the noise detecting unit has detected the absence of noise after detecting the presence of noise, decrease the first coefficient to a value before detection of the presence of noise.

5. The audio signal processing circuit of claim 4, wherein the low-pass filter and the high-pass filter each is a Linkwitz-Riley filter.

6. An audio signal processing circuit comprising:
a demodulation circuit for demodulating an audio signal to provide a demodulated audio signal;
a low-pass filter for filtering the demodulated audio signal to provide a first signal, and having predetermined phase characteristics;
a high-pass filter for filtering the demodulated audio signal to provide a second signal, and having the predetermined phase characteristics;
a first amplifier for amplifying the first signal according to a first coefficient to provide a third signal;
a second amplifier for amplifying the second signal according to a second coefficient to provide a fourth signal;
an adding unit for adding the third and fourth signals to provide an output audio signal; and
a noise control circuit that in response to detecting noise in the audio signal decreases the second coefficient below the first coefficient.

7. The audio signal processing circuit of claim 6 where the noise control circuit comprises:
a noise detecting unit configured to detect a presence of noise or an absence of noise in the audio signal; and
a coefficient control unit coupled to the noise detecting unit and configured to decrease the second coefficient below the first coefficient when the noise detecting unit has detected the presence of noise.

8. The audio signal processing circuit of claim 7, wherein:
the coefficient control unit is further configured to, when the noise detecting unit has detected the absence of noise after detecting the presence of noise, increase the second coefficient to a value before detection of the presence of noise.

9. The audio signal processing circuit of claim 7, wherein:
the coefficient control unit is further configured to, when the noise detecting unit has detected the presence of noise, decrease the second coefficient as well as increase the first coefficient so that the second coefficient becomes smaller than the first coefficient.

10. The audio signal processing circuit of claim 7, wherein:
the coefficient control unit is further configured to, when the noise detecting unit has detected the absence of noise after detecting the presence of noise, decrease the first coefficient to a value before detection of the presence of noise.

11. The audio signal processing circuit of claim 6, wherein:
each of the low-pass filter and the high-pass filter is a Linkwitz-Riley filter.

12. The audio signal processing circuit of claim 6, further comprising:
an analog to digital converter for converting an analog intermediate frequency signal into a digital signal to provide the audio signal.

13. The audio signal processing circuit of claim 12, further comprising:
a digital to analog converter for converting the audio output signal to an analog signal to form a second audio output signal.

14. A method comprising:
demodulating an audio signal to provide a demodulated audio signal;
low-pass filtering the demodulated audio signal with predetermined phase characteristics to provide a first signal;
high-pass filtering the demodulated audio signal with the predetermined phase characteristics to provide a second signal;
amplifying the first signal according to a first coefficient to provide a third signal;
amplifying the second signal according to a second coefficient to provide a fourth signal;
adding the third and fourth signals to provide an output audio signal; and
detecting a presence of noise in the audio signal or an absence of noise in the audio signal; and
decreasing the second coefficient below the first coefficient in response to detecting the presence of noise in the audio signal.

15. The method of claim 14, further comprising:
in response to detecting the absence of noise after detecting the presence of noise, increasing the second coefficient to a value before detection of the presence of noise.

16. The method of claim 14, further comprising:
in response to detecting the presence of noise, decreasing the second coefficient as well as the first coefficient so that the second coefficient becomes smaller than the first coefficient.

17. The method of claim 14, further comprising:
in response to detecting the absence of noise after detecting the presence of noise, decreasing the first coefficient to a value before detection of the presence of noise.

18. The method of claim 14, further comprising:
the low-pass filtering comprises low-pass filtering using a Linkwitz-Riley low-pass filter;
and the high-pass filtering comprises high-pass filtering using a Linkwitz-Riley high-pass filter.

19. The method of claim 14, further comprising:
converting an analog intermediate frequency signal to a digital signal to form the audio signal.

20. The method of claim 19, further comprising:
converting the audio output signal to an analog signal to for a second audio output signal.

* * * * *